(12) United States Patent
Prokopowicz et al.

(10) Patent No.: US 8,603,728 B2
(45) Date of Patent: Dec. 10, 2013

(54) POLYMER COMPOSITION AND PHOTORESIST COMPRISING THE POLYMER

(75) Inventors: Gregory P. Prokopowicz, Worcester, MA (US); Gerhard Polhers, Needham, MA (US); Mingqi Li, Shrewsbury, MA (US); Chunyi Wu, Shrewsbury, MA (US); Cong Liu, Shrewsbury, MA (US); Cheng-bai Xu, Southborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/482,559

(22) Filed: May 29, 2012

(65) Prior Publication Data

US 2012/0301823 A1 Nov. 29, 2012

Related U.S. Application Data

(60) Provisional application No. 61/490,883, filed on May 27, 2011.

(51) Int. Cl.
  *G03F 7/039* (2006.01)
  *C08F 214/18* (2006.01)
  *C08F 218/14* (2006.01)
  *C08F 22/14* (2006.01)

(52) U.S. Cl.
  USPC ........ 430/270.1; 526/244; 526/242; 526/245; 526/270; 526/268; 526/281; 526/309; 526/321

(58) Field of Classification Search
  None
  See application file for complete search history.

(56) References Cited

U.S. PATENT DOCUMENTS

| | | | | |
|---|---|---|---|---|
| 5,155,252 | A * | 10/1992 | Yamamoto et al. | 560/190 |
| 5,185,403 | A * | 2/1993 | Lewarchik et al. | 525/199 |
| 5,229,245 | A * | 7/1993 | Lin et al. | 430/190 |
| 6,011,119 | A * | 1/2000 | Matsumoto et al. | 525/221 |
| 6,254,878 | B1 * | 7/2001 | Bednarek et al. | 424/401 |
| 7,247,419 | B2 * | 7/2007 | Chen et al. | 430/281.1 |
| 2002/0188072 | A1 * | 12/2002 | Kanakura et al. | 525/165 |
| 2006/0008736 | A1 * | 1/2006 | Kanda et al. | 430/270.1 |
| 2006/0127801 | A1 | 6/2006 | Momose et al. | |
| 2006/0216643 | A1 * | 9/2006 | Li et al. | 430/270.1 |
| 2006/0246373 | A1 * | 11/2006 | Wang | 430/270.1 |
| 2011/0244188 | A1 * | 10/2011 | Komoriya et al. | 428/156 |
| 2012/0034560 | A1 * | 2/2012 | Nakahara et al. | 430/270.1 |
| 2012/0040294 | A1 * | 2/2012 | Maeda et al. | 430/325 |

FOREIGN PATENT DOCUMENTS

| | | | |
|---|---|---|---|
| EP | 0875496 | A1 | 11/1998 |
| EP | 1630607 | A2 | 3/2006 |
| EP | 2287667 | A1 | 2/2011 |
| EP | 1970760 | A1 * | 3/2013 |
| JP | 63-127237 | | 5/1988 |
| JP | 10060056 | A | 3/1998 |
| JP | 2005272807 | A | 10/2005 |
| JP | 2007-284368 | A * | 11/2007 |
| JP | 2007-284381 | A * | 11/2007 |
| JP | 2008-165146 | A * | 7/2008 |
| WO | WO 2008/123560 | A * | 10/2008 |
| WO | WO 2010071029 | a * | 6/2010 |
| WO | WO-2010/123000 | a1 * | 10/2010 |

OTHER PUBLICATIONS

English translation of JP, 2008-165146, A (2008) from machine translation from AIPN Japan Patent Office National Center for Industrial Property Information and Training, generated Mar. 15, 2013. 64 pages.*
English translation of JP, 2007-284381, A (2007) from machine translation from AIPN Japan Patent Office National Center for Industrial Property Information and Training, generated Mar. 15, 2013. 17 pages.*
English translation of JP, 2007-284368, A (2007) from machine translation from AIPN Japan Patent Office National Center for Industrial Property Information and Training, generated Mar. 15, 2013. 25 pages.*
Guschin et al, Anal Bioanal CHem (2010) 398: 1661-1673 published online Jul. 23, 2010.*
Japanese Patent No. 10060056; Publication Date: Mar. 3, 1998; Abstract Only, 4 pages.
Japanese Patent No. 63-127237; Publication Date: May 31, 1988; Abstract Only, 1 page.
Japanese Patent No. 2005272807; Publication Date: Oct. 6, 2005; Machine Translation of Abstract, 2 pages.
European Search Report dated Oct. 15, 2012; Application No. 12168975.6; 5 pages.
Database WPI Week 200513, Thomson Scientific, London, GB; AN 2005-114814, XP002682769 & JP 2005008756A (Daicel Chem Ind Ltd) Jan. 13, 2005; Abstract, 4 pages.

* cited by examiner

*Primary Examiner* — Cynthia Hamilton
(74) *Attorney, Agent, or Firm* — Cantor Colburn LLP

(57) ABSTRACT

A copolymer comprises the polymerized product of a base-soluble monomer of formula (I):

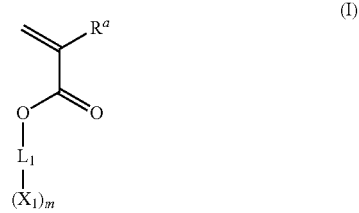

wherein $R^a$ is H, F, $C_{1-10}$ alkyl, or $C_{1-10}$ fluoroalkyl, $L_1$ is an m valent $C_{2-30}$ alkylene, $C_{3-30}$ cycloalkylene, $C_{6-30}$ arylene, $C_{7-30}$ aralkylene group, $X_1$ is independently a base-soluble organic group comprising β-diketone, β-ester-ketone, β-diester, or a combination comprising at least one of the foregoing; and an additional monomer copolymerizable with the base-soluble monomer of formula (I).

7 Claims, 1 Drawing Sheet

A　　　　　　　　　　　B

A　　　　　　　　　　　B

POLYMER COMPOSITION AND PHOTORESIST COMPRISING THE POLYMER

CROSS-REFERENCE TO RELATED APPLICATION

This application is a nonprovisional filing of provisional U.S. application No. 61/490,883, filed on May 27, 2011, the contents of which are incorporated herein by reference in their entirety.

BACKGROUND

Photoresists, and in particular those formulated for 193 nm lithography, tend to have very low unexposed dissolution rates. Unlike deep ultraviolet (DUV) photoresist polymers for use at 248 nm exposure wavelengths that are primarily based on the base-soluble 4-hydroxystyrene monomer (HSM) derived unit which permits dissolution of the polymer in alkaline developer, 193 nm photoresist polymers cannot incorporate the most common aromatic monomers such as HSM which has a high absorbance at 193 nm. Instead, monomeric units incorporating other base soluble groups, or those aromatic monomers having a relatively low absorbance at 193 nm, have been used, such as the less absorbing 2-hydroxy-6-vinyl-naphthalene or monomers incorporating a hexafluoroalcohol (HFA) unit. To date however, photoresists incorporating polymers based on these base-soluble groups can exhibit poor line width roughness (LWR). In addition, in the case of HFA-based monomers, polymers incorporating these groups have undesirably reduced etch resistance due to the presence of fluorine, relative to non-fluorinated monomers such as HSM.

Other functional groups with base solubility and high transparency have been described, such as those found in Japanese Patent Nos. JP 63-127237, JP 1998-060056, and JP 1999-1065953, and in European Patent No. EP 0 875 496 A1. However, there remains a need for photoresist polymers for 193 nm, which exhibit improved LWR and etch control.

STATEMENT OF INVENTION

The above and other deficiencies of the prior art may be overcome by, in an embodiment, a copolymer comprising the polymerized product of a base-soluble monomer of formula (I):

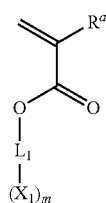

(I)

wherein $R^a$ is H, F, $C_{1-10}$ alkyl, or $C_{1-10}$ fluoroalkyl, $L_1$ is an m valent $C_{2-30}$ alkylene, $C_{3-30}$ cycloalkylene, $C_{6-30}$ arylene, $C_{7-30}$ aralkylene group, $X_1$ is independently a base-soluble organic group comprising β-diketone, β-ester-ketone, β-diester, or a combination comprising at least one of the foregoing; and an additional monomer copolymerizable with the base-soluble monomer of formula (I).

In another embodiment, a photoresist comprises a copolymer comprising the polymerized product of a base-soluble monomer of formula (I):

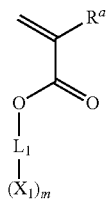

(I)

wherein $R^a$ is H, F, $C_{1-10}$ alkyl, or $C_{1-10}$ fluoroalkyl, $L_1$ is an m valent $C_{2-30}$ alkylene, $C_{3-30}$ cycloalkylene, $C_{6-30}$ arylene, $C_{7-30}$ aralkylene group, $X_1$ is independently a base-soluble organic group comprising β-diketone, β-ester-ketone, β-diester, or a combination comprising at least one of the foregoing, and an additional monomer copolymerizable with the base-soluble monomer of formula (I); a photoacid generator; and optionally a second acid sensitive polymer and an amine or amide additive.

In another embodiment, a coated film comprises a photoresist comprising a copolymer comprising the polymerized product of a base-soluble monomer of formula (I):

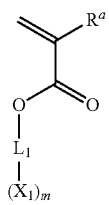

(I)

wherein $R^a$ is H, F, $C_{1-10}$ alkyl, or $C_{1-10}$ fluoroalkyl, $L_1$ is an m valent $C_{2-30}$ alkylene, $C_{3-30}$ cycloalkylene, $C_{6-30}$ arylene, $C_{7-30}$ aralkylene group, $X_1$ is independently a base-soluble organic group comprising β-diketone, β-ester-ketone, β-diester, or a combination comprising at least one of the foregoing, and an additional monomer copolymerizable with the base-soluble monomer of formula (I); a photoacid generator; and optionally, a second acid sensitive polymer, and an amine or amide additive.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1:
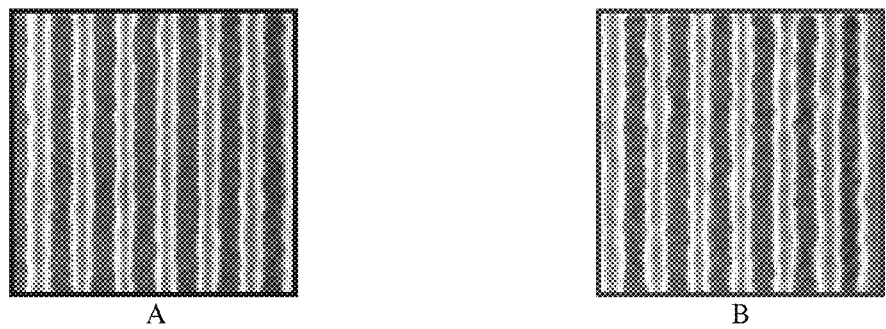
FIGS. 1A and 1B show top-down scanning electron microscope (SEM) images of an exemplary photoresist including (A) a polymer having a beta-dicarbonyl compound included, and (B) a control without the beta-dicarbonyl-containing polymer.

Disclosed herein is a photoresist polymer that incorporates a base-soluble unit based on the beta-dicarbonyl structure, —C(=O)—CH$_2$—C(=O)—. Variations of the beta-dicarbonyl structure can include a beta-diketone (—R—C(=O)—CH$_2$—C(=O)—R'), beta-diester (—O—C(=O)—CH$_2$—C(=O)—O—) or a beta-ester-ketone (—O—C(=O)—CH$_2$—C(=O)—R.

Developer solubility in such groups is derived from the acidic protons of the methylene spacer. The pKa of the —CH$_2$— spacer in non-fluorinated beta-dicarbonyls is approximately 10-11, which is slightly weaker than that of an OH from a phenolic moiety or from a hexafluoroalcohol (HFA) group such as hexafluoroisopropanol. Inclusion of fluorinated groups in the beta-dicarbonyl structure, such as in a beta-diketone or beta-ester-ketone where a fluorinated group such as CF$_3$ is attached to the carbonyl or the methylene) exhibits a further decreased pKa, and greater base solubility, but may not have as good etch resistance. The use of a beta-dicarbonyl group thus provides base solubility without excessive absorbance and without the presence of excessive amounts of fluorine which decreases etch resistance of the polymer.

Such polymers having beta-dicarbonyl groups capable of dissolution in alkaline developer should, even under poor imaging conditions typically referred to as low normalized image log slope (NILS) conditions, improve the cleanness of the resist line, especially at the bottom interface. A secondary effect of the cleaner bottom interface is improved LWR. Resist scum, commonly referred to as footing at the bottom interface will contribute to the line width measurement. In addition, use of a base soluble monomer having beta-dicarbonyl groups provides improved performance in adhesion and reduces undercut of developed line features, and thereby improves resistance to pattern collapse in the developed photoresist, and improves overall cross-sectional feature profile.

The copolymer having the base-soluble beta dicarbonyl groups includes the polymerized product of a base-soluble monomer of formula (I).

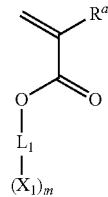

(I)

In formula (I), R$^a$ is H, F, C$_{1-10}$ alkyl, or C$_{1-10}$ fluoroalkyl. Preferably, R$^a$ is H, C$_{1-6}$ alkyl, or CF$_3$. As used throughout this specification, the prefix "fluoro" means one or more fluorine groups attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms. "Substantially all" in this context means greater than or equal to 90%, preferably greater than or equal to 95%, and still more specifically greater than or equal to 98% of all atoms attached to carbon are fluorine atoms.

L$_1$ in formula (I) is an m+1 valent C$_{2-30}$ alkylene, C$_{3-30}$ cycloalkylene, C$_{6-30}$ arylene, C$_{7-30}$ aralkylene group, or a combination comprising at least one of the foregoing. The linking groups are preferably non-aromatic, and may be linear or branched alkylene or cycloalkylene including monocyclic, polycyclic, or fused polycyclic (sometimes referred to as "caged") structures. The m+1 valency of L$^1$ may be any valency described as a point of attachment to a polymerizable moiety, and to one or more base-soluble groups. Preferably, m+1 is 2 to 5. Exemplary linking groups L$_1$ may be substituted or unsubstituted and may include ethylene, 1,2-propylene, 1,3-propylene, 1,4-butylene, 2-methyl-1,4-butylene, 2,2-dimethyl-1,3-propylene, 1,5-pentylene, 1,6-hexylene, 1,8-octylene, 1,4-cyclohexylene, 1,3,5-cyclohexylene, 1,4-cyclohexylenedimethylene, norbornylenes, 1,1-, 1,2-, and 1,3-adamantylene, trisubstituted adamantylenes (e.g., 1,3,5-adamantylene), fluorinated versions of the above including perfluorinated versions, and the like, and combinations comprising at least one of the foregoing.

Also in formula (I), X$_1$ is independently a base-soluble organic group comprising β-diketone, β-ester-ketone, β-diester, or a combination comprising at least one of the foregoing. Acyclic or cyclic groups incorporating the beta-dicarbonyl group may be included in the structure. Preferably, each X$_1$ is independently:

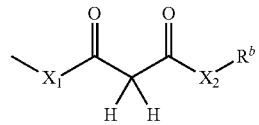

wherein X$_2$ is O or a single bond, and R$^b$ is C$_{1-20}$ alkyl; C$_{1-20}$ fluoroalkyl, C$_{3-20}$ cycloalkyl, C$_{6-20}$ aryl, C$_{7-20}$ aralkyl, or a combination comprising at least one of the foregoing. Such groups may include, more specifically, those having the following structures:

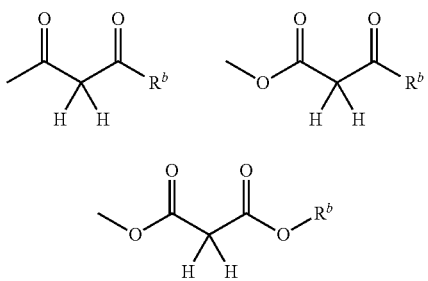

where R$^b$ is as defined above. Exemplary R$^b$ groups include methyl, ethyl, butyl, cyclohexyl, trifluoromethyl, perfluoroethyl, and the like.

L$^1$ and X$^1$ may be substituted or unsubstituted. As used throughout the specification and unless otherwise specified, "substituted" means having a substituent group including —OH, —SH, —CN, halogens including F, Cl, Br, or I, carboxylic acid, carboxylate, C$_{1-10}$ alkyl, C$_{3-10}$cycloalkyl, C$_{6-10}$ aryl, C$_{7-10}$ aralkyl, C$_{1-10}$ alkyl, C$_{1-10}$ fluoroalkyl, C$_{3-10}$-fluorocycloalkyl, C$_{6-10}$ fluoroaryl, C$_{7-10}$ fluoroaralkyl, C$_{1-10}$ alkyl, C$_{1-10}$ alkoxy, C$_{3-10}$ cycloalkoxy, C$_{6-10}$ aryloxy, C$_{1-10}$alkyl, a C$_{2-10}$ ester-containing group, a C$_{1-10}$ amide-containing group, a C$_{2-10}$ imide-containing group, a C$_{3-10}$ lactone-containing group, a C$_{3-10}$ lactam-containing group, a C$_{2-10}$ anhydride-containing group, or a combination comprising at least one of the foregoing.

In one embodiment, the base-soluble monomer has formula (II):

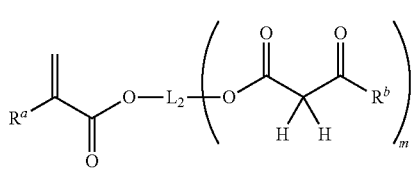

(II)

wherein $R^a$ is H, F, $C_{1-6}$ alkyl, or $CF_3$, $L_2$ is m valent and is a $C_{2-30}$ alkylene, $C_{3-30}$ cycloalkylene, $C_{6-30}$ arylene, $C_{7-30}$ aralkylene group, m is 1 or 2, and $R^b$ is $C_{1-20}$ alkyl; $C_{1-20}$ fluoroalkyl, $C_{3-20}$ cycloalkyl, $C_{6-20}$ aryl, $C_{7-20}$ aralkyl, or a combination comprising at least one of the foregoing.

Exemplary base-soluble monomers include:

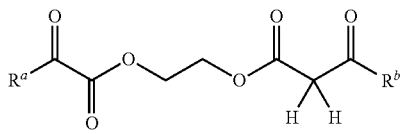

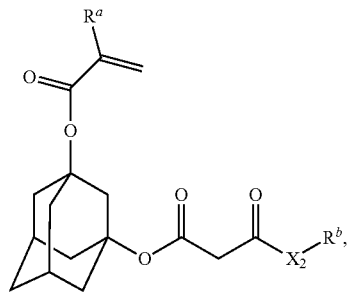

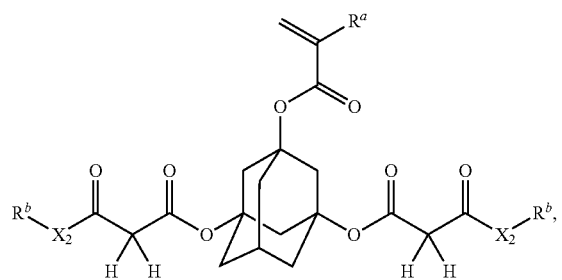

or a combination comprising at least one of the foregoing, wherein $R^a$ is H, F, $C_{1-6}$ alkyl, or $CF_3$, $X_2$ is O or a single bond, and $R^b$ is $C_{1-20}$ alkyl; $C_{1-20}$ fluoroalkyl, $C_{3-20}$ cycloalkyl, $C_{6-20}$ aryl, $C_{7-20}$ aralkyl, or a combination comprising at least one of the foregoing.

Specific exemplary base-soluble monomers disclosed herein include the following methacrylate monomers 2-(acetoacetyloxy)ethyl methacrylate (AAEM), 3-(acetoacetyloxy) adamantyl methacrylate (AAHAMA), and 3,5-di(acetoacetyloxy) adamantyl methacrylate (Di-AAHAMA), shown below, respectively:

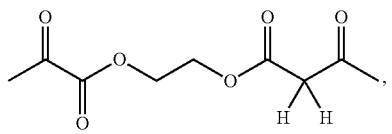

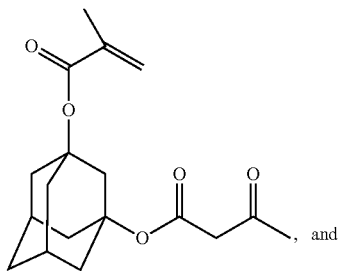

, and

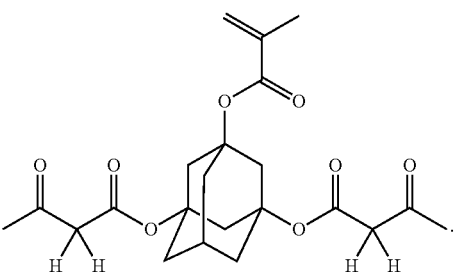

.

The copolymer further includes an additional monomer copolymerizable with the base-soluble monomer of formula (I). Any such additional monomer suitable for forming a 193 nm photoresist polymer may be used, so long as the acid-deprotectable monomer is copolymerizable with the base-soluble monomers described herein, and does not significantly adversely affect the desired properties of the base-soluble monomer. Preferably, the additional monomer is a (meth)acrylate monomer having an acid deprotectable base soluble group, a (meth)acrylate monomer having a lactone functional group, a (meth)acrylate monomer having a base-soluble group not identical to that of formula (I), or a combination comprising at least one of the foregoing monomers. As used herein, "(meth)acrylate" means acrylate or methacrylate or a combination comprising at least one of these polymerizable groups. Other monomers, such as (meth)acrylate monomers for improving adhesion, etch resistance, etc., may also be included.

Any acid-deprotectable monomer useful for forming a 193 nm photoresist polymer may be used. Exemplary acid-deprotectable monomers copolymerizable with the beta-dicarbonyl monomer of formula (I) may include, but are not limited to:

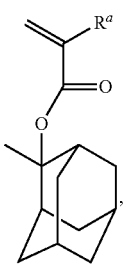 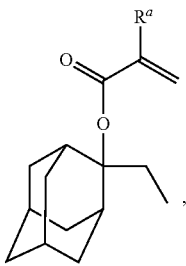

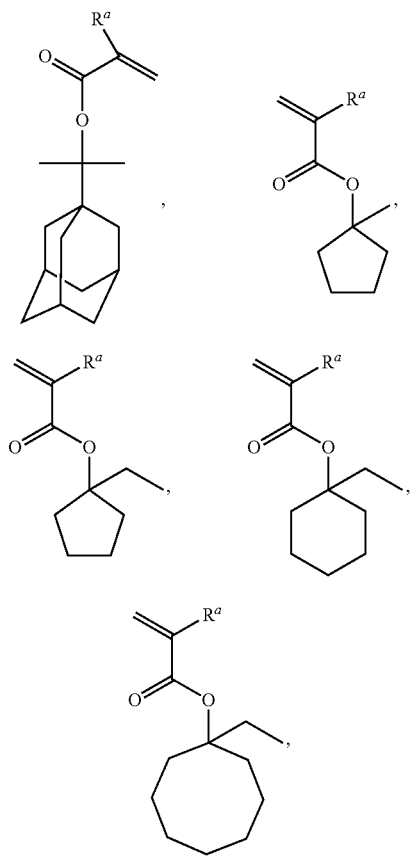

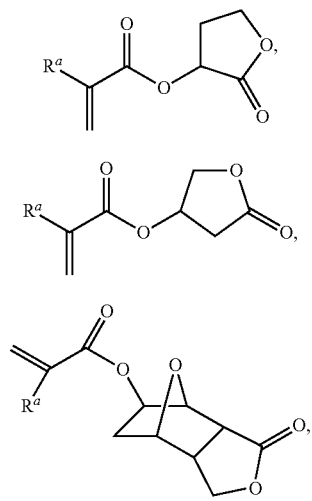

or a combination comprising at least one of the foregoing monomers, wherein $R^a$ is H, F, $C_{1-10}$ alkyl, or $C_{1-10}$ fluoroalkyl.

Any lactone-containing monomer useful for forming a 193 nm photoresist polymer may be used. Exemplary such lactone-containing monomers copolymerizable with the beta-dicarbonyl monomer of formula (I) may include, but are not limited to:

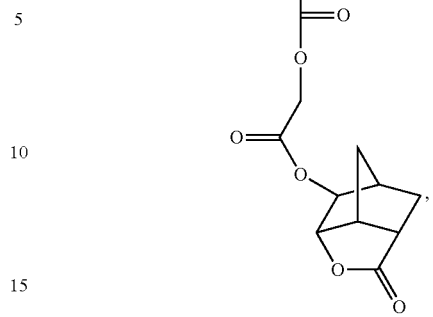

or a combination comprising at least one of the foregoing monomers, wherein $R^a$ is H, F, $C_{1-10}$ alkyl, or $C_{1-10}$ fluoroalkyl.

Any additional base-soluble monomer not identical to formula (I) and useful for forming a 193 nm photoresist polymer may be used. Exemplary additional base-soluble (meth)acrylate monomers may include, but are not limited to:

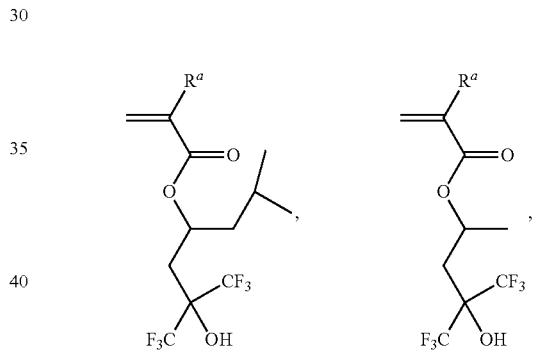

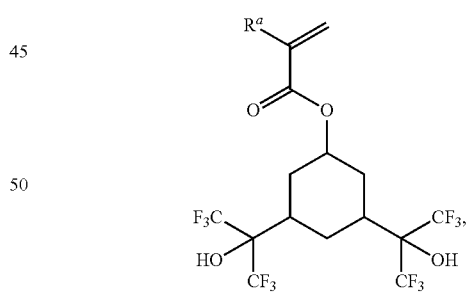

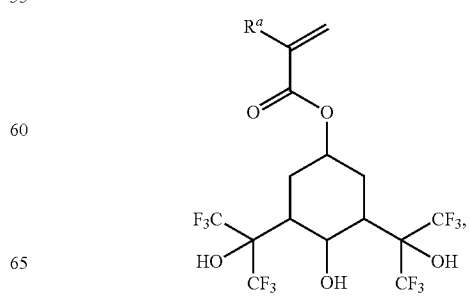

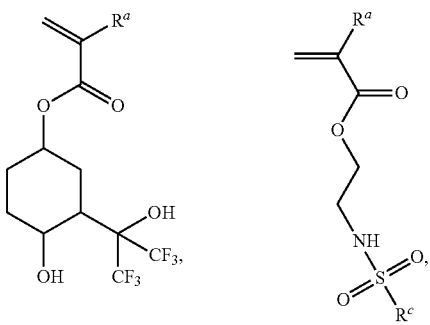

or a combination comprising at least one of the foregoing monomers, wherein $R^a$ is H, F, $C_{1-10}$ alkyl, or $C_{1-10}$ fluoroalkyl, and $R^c$ is a $C_{1-4}$ perfluoroalkyl group.

The polymer may also include other monomers, including cage-structured monomers for enhancing etch resistance, with or without functional groups for improving adhesion. An exemplary additional monomers may include:

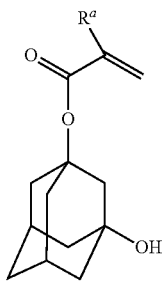

or a combination comprising the foregoing and at least one additional monomer, wherein $R^a$ is H, $C_{1-6}$ alkyl, or $CF_3$.

In another embodiment, a photoresist is disclosed, which includes a copolymer comprising the polymerized product of a base-soluble monomer of formula (I), and an additional monomer copolymerizable with the base-soluble monomer of formula (I) as described herein; a photoacid generator; and optionally, a second acid sensitive polymer, and an amine or amide additive.

The second acid-sensitive polymer may be any polymer suitable for formulating photoresists for use at 193 nm. Such acid-sensitive polymers include an acid sensitive polymer comprising acid sensitive groups and lactone-containing groups, where the acid sensitive group deprotects a base-soluble group on exposure to acid.

The photoresist composition may further an amine or amide compound, referred to herein as a quencher. Quenchers may more broadly include, for example, those based on hydroxides, carboxylates, amines, imines, and amides. In an embodiment, a useful quencher is an amine, an amide, or a combination comprising at least one of the foregoing. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBN), N-protected amines such as N-t-butylcarbonyl-1,1-bis(hydroxymethyl)-2-hydroxyethylamine (TBOC-TRIS), or ionic quenchers including quaternary alkyl ammonium salts such as tetrabutylammonium hydroxide (TBAH) or tetrabutyl ammonium lactate.

Other components of the photoresist may include solvents and surfactants.

Solvents generally suitable for dissolving, dispensing, and coating the components include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist composition disclosed herein may include the polymer in an amount of 50 to 99 wt %, specifically 55 to 95 wt %, more specifically 60 to 90 wt %, and still more specifically 65 to 90 based on the total weight of solids. It will be understood that "polymer" used in this context of a component in a photoresist may mean only the copolymer disclosed herein, or a combination of the polymer with another polymer useful in a photoresist. The photoacid generator may be present in the photoresist in an amount of 0.01 to 20 wt %, specifically 0.1 to 15 wt %, and still more specifically 0.2 to 10 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photoacid generator, quencher, surfactant, and any optional additives, exclusive of solvent.

The photoresist disclosed herein may be used to form a film comprising the photoresist, where the film on the substrate constitutes a coated substrate. Such a coated substrate includes: (a) a substrate having one or more layers to be patterned on a surface thereof; and (b) a layer of the photoresist composition over the one or more layers to be patterned. Preferably, patterning is carried out using ultraviolet radiation at wavelength of less than 248 nm, and in particular, at 193 nm. In an embodiment, a patternable film comprises a copolymer comprising the base soluble monomer of formula (I).

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 200 mm, 300 mm, or larger in diameter, or other dimensions useful for wafer fabrication production.

The invention is further illustrated by the following examples. All compounds and reagents used herein are available commercially except where a procedure is provided below. 2-(Acetoacetyloxy)ethyl methacrylate (AAEM) is available commercially from Eastman Chemical.

3-(Acetoacetyloxy)adamantyl methacrylate (AAHAMA) was prepared according to the following procedure. 65.6 g of 3-hydroxyadamantan-1-yl methacrylate (HAMA) (277.6 mmol) and 42.1 g of 95% pure 2,2,6-trimethyl-4H-1,3-dioxin-4-one (277.6 mmol) were mixed with 0.2 g of CYANOX® 1790 inhibitor in 400 ml of toluene. After refluxing (110° C.) for 4 hours, the reaction was cooled, 10 g of activated charcoal and 400 ml of toluene were added, and the mixture stirred overnight. After filtration, another 10 g of activated charcoal was added, and the mixture stirred for an additional 12 h., then filtered. The filtrate was concentrated and run through a silica gel flash column with ethyl acetate as eluant. The solvent was then removed to yield 80 g (90%) of 3-acetoacetoxyadamantan-1-yl methacrylate was obtained.

An exemplary AAEM-based photoresist polymer (Polymer 1) was prepared according to a procedure similar to the following procedure. A solution of 1-isopropyl-adamantanyl methacrylate (IPAMA) (20 mmol), 1-methylcyclopentyl methacrylate (MCPMA) (20 mmol), 2-oxo-tetrahydro-furan-3-yl methacrylate ($\alpha$-GBLMA) (30 mmol), 3-oxo-4,10-dioxa-tricyclo[5.2.1.0$^{2,6}$]dec-8-yl methacrylate (ODOTMA) (20 mmol), and 2-(acetoacetyloxy)ethyl methacrylate (AAEM) (10 mmol) dissolved in 30 g of tetrahydrofuran (THF) is degassed by bubbling with nitrogen and charged to a 500 ml flask equipped with a condenser, nitrogen inlet and mechanical stirrer, along with an additional 10 g of degassed THF. The solution is brought to reflux, and 5 g of dimethyl-2,2-azodiisobutyrate is dissolved in 5 g of THF and charged in to the flask. The polymerization mixture is then stirred for about 4 hours at reflux, after which time the reaction is diluted with 5 g of THF and the polymerization mixture cooled to room temperature. The polymer is precipitated by addition to 1.0 L of isopropanol, collected by filtration, re-precipitated by dissolving in 50 g THF and addition to another 1.0 L isopropanol, and collected and dried under vacuum at 45° C. for 48 h. to yield the polymer poly(IAMA/_MCPMA/$\alpha$-GBLMA/ODOTMA/AAEM) (20/20/30/20/10). Mw=10,400; Mw/Mn=1.53.

A control photoresist polymer (Polymer 2) was prepared according to a procedure similar to the following procedure. A solution of 1-isopropyl-adamantanyl methacrylate (IPAMA) (20 mmol), 1-methylcyclopentyl methacrylate (MCPMA) (20 mmol), 2-oxo-tetrahydro-furan-3-yl methacrylate ($\alpha$-GBLMA) (30 mmol), 3-oxo-4,10-dioxa-tricyclo[5.2.1.0$^{2,6}$]dec-8-yl methacrylate (ODOTMA) (20 mmol), and 3-hydroxy-adamantanyl methacrylate (HAMA) (10 mmol) dissolved in 30 g of tetrahydrofuran (THF) is degassed by bubbling with nitrogen and charged to a 500 ml flask equipped with a condenser, nitrogen inlet and mechanical stirrer, along with an additional 10 g of degassed THF. The solution is brought to reflux, and 5 g of dimethyl-2,2-azodiisobutyrate is dissolved in 5 g of THF and charged in to the flask. The polymerization mixture is then stirred for about 4 hours at reflux, after which time the reaction is diluted with 5 g of THF and the polymerization mixture cooled to room temperature. The polymer is precipitated by addition to 1.0 L of isopropanol, collected by filtration, re-precipitated by dissolving in 50 g THF and addition to another 1.0 L isopropanol, and collected and dried under vacuum at 45° C. for 48 h. to yield the polymer poly(IAMA/MCPMA/$\alpha$-GBLMA/ODOTMA/HAMA) (20/20/30/20/10). Mw=9,000.

An exemplary AAHAMA-based photoresist polymer (Polymer 3) was prepared according to the following procedure. A solution of 1-ethylcyclopentyl methacrylate (ECPMA) (38.7 g, 147.3 mmol), 2-oxo-tetrahydro-furan-3-yl methacrylate ($\alpha$-GBLMA) (63 g, 369.3 mmol), a 1:1 molar mixture of 3-oxooctahydro-4,7-epoxyisobenzofuran-5-yl methacrylate/1-oxooctahydro-4,7-epoxyisobenzofuran-5-yl methacrylate (ODOTMA) (11.7 g, 49.11 mmol), and 2-(acetoacetyloxy)adamantyl methacrylate (AAHAMA) (7.9 g, 24.6 mmol) dissolved in 60 g of mixed solvent propylene glycol monomethyl ether acetate (PGMEA), gamma butyrolactone (GBL) and ethyl lactate (EL) (60/20/20 w/w) was degassed by bubbling with nitrogen and charged to a 1-L flask equipped with a condenser, nitrogen inlet and mechanical stirrer, and the temperature was raised to 70° C. A solution of dimethyl-2,2-azo(bis)diisobutyrate (VAZO V-601 initiator, DuPont) (6.3 g, 27.0 mmol) in 10 g of the mixed solvent (PGMEA/GBL/EL, 60/20/20) was degassed and the initiator solution added over 3.5 hours, followed by another 30 minutes holding at temperature, after which time the reaction was diluted with a further 25 g of the mixed solvent, cooled to room temperature, and precipitated into 20× volume of methanol. The product polymer was collected by filtration, re-dissolved to 30% solids in mixed solvent and re-precipitated in 20× volume of methanol, and collected and dried under vacuum at 45° C. for 12 h. to yield the polymer poly (IAMA/MCPMA/$\alpha$-GBLMA/ODOTMA/AAHAMA) (40/30/20/10).

A control photoresist polymer (Polymer 4) was prepared according to a procedure similar to the following procedure. A solution of 1-ethylcyclopentyl methacrylate (ECPMA) (38.7 g, 147.3 mmol), 2-oxo-tetrahydro-furan-3-yl methacrylate ($\alpha$-GBLMA) (63 g, 369.3 mmol), a 1:1 molar mixture of 3-oxooctahydro-4,7-epoxyisobenzofuran-5-yl methacrylate/1-oxooctahydro-4,7-epoxyisobenzofuran-5-yl methacrylate (ODOTMA) (11.7 g, 49.11 mmol), and 2-(acetoacetyloxy)adamantyl methacrylate (HAMA) (24.5 mmol) dissolved in 60 g of mixed solvent propylene glycol monomethyl ether acetate (PGMEA), gamma butyrolactone (GBL) and ethyl lactate (EL) (60/20/20 w/w) was degassed by bubbling with nitrogen and charged to a 1-L flask equipped with a condenser, nitrogen inlet and mechanical stirrer, and the temperature was raised to 70° C. A solution of dimethyl-2,2-azo(bis)diisobutyrate (VAZO V-601 initiator, DuPont) (6.3 g, 27.0 mmol) in 10 g of the mixed solvent (PGMEA/GBL/EL, 60/20/20) was degassed and the initiator solution added over 3.5 hours, followed by another 30 minutes holding at temperature, after which time the reaction was diluted with a further 25 g of the mixed solvent, cooled to room temperature, and precipitated into 20× volume of methanol. The product polymer was collected by filtration, re-dissolved to 30% solids in mixed solvent and re-precipitated in 20× volume of methanol, and collected and dried under vacuum at 45° C. for 12 h. to yield the polymer poly(IAMA/_MCPMA/$\alpha$-GBLMA/ODOTMA/HAMA) (40/30/20/10). Mw=11,000; Mw/Mn=1.61.

A photoacid generator used in the lithographic evaluations, t-butylphenyl tetramethylenesulfonium 4-adamantanecarboxyl-1,1,2,2-tetrafluorobutane sulfonate (TBPTMS Ad-TFBS) was prepared according to the following five-step procedure.

In the first step, to a 1 L, 3-necked flask equipped with a thermometer, pressure equalizing dropping funnel and condenser w/$N_2$ gas inlet was added 100 g (503 mmol) adamantane acid chloride), 113.2 g (503 mmol) hydroxytetrafluorobromobutane and 400 ml of dichloromethane. The reaction mixture was cooled to 5° C. and a solution of 91.76 gram (603 mmol) of diazobicycloundecane (DBU) in 100 ml $CH_2Cl_2$ was added over 90-120 minutes. After completion of the addition, the reaction mixture was raised to and held at reflux for 20 h. The reaction mixture was washed 4×500 ml with 20% (w/w) aqueous HCl, deionized water to a constant pH of 6. The solvent layer was collected and concentrate under high vacuum at 60° C. to yield 165 g (85%) of pure adamantane-1-carboxylic acid 4-bromo-3,3,4,4-tetrafluoro-butyl ester intermediate product.

In the second step, to a 3 L, 3-neck round bottom flask equipped with a thermometer, overhead stirrer and condenser w/$N_2$ gas inlet, 150 g (387 mmol) of adamantyl fluorobromobutane ester of the first step was added into degassed aqueous acetonitrile solution (750 ml $H_2O$ and 750 ml acetonitrile) containing 155 g (891 mmol) of sodium dithionite and 97.6 g sodium bicarbonate. The reaction mixture was heated to 50° C. for about 18 h. then cooled to room temperature. The aqueous layer was then isolated and washed with 200 ml acetonitrile. The combined acetonitrile solution was dried over $MgSO_4$ and the solvent removed, to leave about 200 g of the intermediate as a waxy solid which was triturated twice with diisopropyl ether (IPE) (600 and 400 ml, respectively) for one hour, collected and dried under vacuum dry at 50° C. for 18 h. to yield 149 g of sodium 1-adamantyl-3,3,4,4-tetrafluorobutane sulfinate intermediate (yield 97.6%).

In the third step, in a 2 L 3-neck round bottom flask equipped with a thermometer, overhead stirrer and condenser w/$N_2$ gas inlet, 140 g (355 mmol) of adamantyl fluorobutane sulfinate from the second step, 92.5 gram (816 mmol) of 30 wt % aqueous hydrogen peroxide solution, 0.28 g (0.85 mmol) of sodium tungstate dihydrate, were mixed with 1,400 ml of deionized water. The reaction mixture was stirred at room temperature 1.5 h, and the excess hydrogen peroxide was quenched with 1.5 eq. of sodium sulfite ($Na_2SO_3$). The mixture was combined with 2 L of ethyl acetate, allowed to separate into aqueous and organic layers. The middle organic layer was separated, extracted 2×1.5 L with ethyl acetate, and the extracts combined with the bottom oily layer and concentrated to afford about 157 g of a waxy solid. The solid was dissolved in 260 ml of acetone and precipitated into 2,600 ml of diisopropyl ether (IPE). The resulting compound was collected by filtration and the white solid so obtained was washed with 200 ml of IPE and vacuum dried at 50° C. for 16 h. to yield 87 g (60%) of the sodium 1-adamantyl-3,3,4,4-tetrafluorobutane sulfonate intermediate.

In the fourth step, in a 2 L 3-neck round bottom flask equipped with a thermometer, overhead stirrer and condenser w/$N_2$ gas inlet, 50 g (121.9 mmol) of adamantyl fluorobutane sulfonate from the second step, and 50.1 g (110.8 mmol) of bis(t-butylphenyl) iodonium acetate, were mixed with 400 ml of methylene chloride and 400 ml of deionized water. The reaction mixture was stirred at room temperature for 64 h. The mixture was added to a 2 L separatory funnel and the layers were separated. The water layer was washed 2×100 ml of methylene chloride, which were combined and washed with 500 ml of 1% (w/w) aqueous ammonium hydroxide solution, followed by washed 6×500 ml with deionized water. The methylene chloride solution was dried over magnesium sulfate, concentrated to 200 g total weight, precipitated into 4 L of heptane, and the precipitate collected by filtration and washed with 2×200 ml of heptanes and dried under vacuum to yield 86 g (90%) of the bis(t-butylphenyl) iodonium 1-adamantyl-3,3,4,4-tetrafluorobutane sulfonate intermediate.

In the fifth step, in a 1 L 3-neck round bottom flask equipped with a thermometer, overhead stirrer and condenser w/$N_2$ gas inlet, 85 g (108.9 mmol) of bis(t-butylphenyl)iodonium 1-adamantyl-3,3,4,4-tetrafluorobutane sulfonate, 10.6 g (119.8 mmol) of tetrahydrothiophene, 2.84 g of cupric benzoate were combined with 400 ml of anhydrous chlorobenzene. The reaction mixture was heated to 125° C. for 5 h. and allowed to cool overnight. Solvent was reduced by atmospheric distillation to a final volume of 200 ml and the resultant precipitated into 2.5 L of diisopropyl ether (IPE) to yield a pale gray solid when dried. The solid was dissolved in 500 ml of methylene chloride, washed with 2×250 ml of 10 wt % ammonium hydroxide aqueous solution, and 6×500 ml with deionized water. The amber colored organic layer was dried over magnesium sulfate and stirred with 10 g of decolorizing charcoal for 2 h. and filtered to afford a nearly colorless solution. The methylene chloride solution was concentrated to 100 ml, diluted with about 50 to 100 ml of IPE, and precipitated 2 L of IPE. The resulting solid precipitate was air dried for 3 h. then vacuum dried at 50° C. to afford crude product, which was recrystallized with ethyl acetate, collected and dried under vacuum to yield 44 g (79%) of t-Butylphenyl tetramethylenesulfonium 4-adamantanecarboxyl-1,1,2,2-tetrafluorobutane sulfonate (TBPTMS Ad-TFBS) as a white solid.

t-Butylphenyl tetramethylenesulfonium 4-(3-hydroxyadamantanecarboxyl)-1,1,2,2-tetrafluorobutane sulfonate (TBPTMS 3OH-Ad TFBS) was prepared by a three-step synthesis as described below.

In step 1, to a 250 ml flask were added 15 g of 3-hydroxyadamantane-1-carboxylic acid and 150 mL of anhydrous tetrahydrofuran (THF) under a nitrogen ($N_2$) sweep. To this mixture was added 1',1'-carbonyldiimidazole (CDI, 13.65 g) in portions of 4-5 g over 30 min, and stirred at room temp for 3 h. The mixture was then heated to reflux and 4-bromo-3,3,4,4-tetrafluoro-butan-1-ol (18 g) was added over 5 min. and maintained at reflux for 15 h. The reaction was cooled to 25° C., diluted with 4-5 volumes of water and separated. The bottom layer (an amber oil) was collected and the top layer washed with 300 ml of ethyl acetate. The amber oil and the ethyl acetate solution were combined, washed with deionized water (4×200 ml) to pH 6.5, the ethyl acetate layer dried over $MgSO_4$, and the solvent removed under reduced pressure to yield the intermediate product as an oil which was used without further purification.

The intermediate product oil (100% yield assumed) was combined with 26.6 g sodium thiosulfite, 19.3 g sodium bicarbonate, 150 ml acetonitrile and 150 ml of deionized water and stirred overnight (16 h.) at 60° C., then cooled to room temperature. The acetonitrile layer was separated, and 100 ml of deionized water was added to it followed by 13 g of 30% (w/w) hydrogen peroxide and 60 mg of catalyst ($NaWO_4.2H_2O$). The reaction solution was stirred for 2-3 h. at room temperature, and after completion, 13 g of sodium bisulfite was added slowly to neutralize any residual $H_2O_2$. To the pale yellow one-phase solution was added 30 g of sodium chloride, resulting in a two-phase solution. The upper layer (phase) was collected, dried over $MgSO_4$ and then precipitated into 1.4 L of methyl t-butylether, and the pale yellow solid collected and dried to yield 13.5 g (42%) of analytically pure sodium 4-(3-hydroxyadamantanecarboxyl)-1,1,2,2-tetrafluorobutane sulfonate (3OH-Ad TFBSNa).

In step 2, to a 500 ml flask were added 19 g of triethylamine, 65 g of 1,4-dibromobutane and 255 ml of methyl t-butylether under nitrogen atmosphere. To this mixture a solution of 25 g of t-butylbenzenethiol and 70 ml of methyl t-butylether over 7 h and was added and stirred overnight. The mixture was then filtered and washed with 1.2 N HCl (2×100 ml) then deionized water (4×100 ml). The methyl t-butylether layer was then dried over $MgSO_4$ and the solvent removed. Excess 1,4-dibromobutane was distilled off under reduced pressure (ca. 1.5 torr at 35-40° C.). $^1$H-NMR indicated the material to be about 95% pure with an in situ yield of 84%. This material was further distilled to recover the purified product (ca. 1.5 torr at 150° C.), with a final yield of 56% of pure 1-(4-bromo-butylsulfanyl)-4-tert-butyl-benzene.

In step 3, to a 3-L round bottom flask equipped with a thermometer, overhead stirrer and condenser with nitrogen gas inlet was added 1-(4-bromo-butylsulfanyl)-4-tert-butyl-benzene (204 g, 677 mmol; from step 2), 3OH-Ad TFBSNa (144 g, 338.5 mmol; from step 1) and 2 liter of acetonitrile. The reaction mixture was heated to reflux for 16 h. then cooled to room temperature. By-product was filtered off and the acetonitrile removed under reduced pressure to provide the crude product as an orange oil. The oil was dissolved in 1 L of ethyl acetate, washed with deionized water (4×1 L), dried with $MgSO_4$, and 5 g of decolorizing charcoal was added. The solution was stirred for 2-3 h. and filtered to provide a very pale yellow solution, which was reduced in volume (400-500 ml) under reduced pressure, and precipitated into 5 L of methyl t-butylether, followed by re-precipitation of the resulting crude product (an oily material) from 400 ml of ethyl acetate into 4 L of methyl t-butylether to provide a nearly colorless oil. The ethyl acetate/methyl t-butylether solution was decanted off and the oil re-dissolved in ethyl acetate (1 L), transferred to a clean flask, and the solvent slowly removed under vacuum to yield 127.5 g of analytically pure TBPTMS 3OH-Ad TFBS (60% yield).

Triphenylsulfonium hexahydro-4,7-epoxyisobenzofuran-1(3H)-one, 6-(2,2'-difluoro-2-sulfonatoacetic acid ester (TPS ODOT-DFMS) was prepared by the following procedure. A mixture of sodium difluorosulfoacetate (5 g), 9-hydroxy-4,10-dioxa-tricyclo[5.2.1.02,6]decan-3-one) (4.21 g) and p-toluene sulfonic acid monohydrate (9.5 g) in toluene (50 mL) was refluxed for 3 days. The reaction mixture was cooled to room temperature and filtered. The solids were extracted with acetonitrile (2×50 mL) and filtered. The acetonitrile filtrate was concentrated to dryness, the residue was partitioned between water (50 mL) and methylene chloride (30 mL), and the phases were separated. The aqueous phase was washed with methylene chloride (2×30 mL) and treated with triphenylsulfonium bromide (8.6 g) and methylene chloride (50 mL). The mixture was stirred at room temperature for 24 h, and the phases were separated. The organic phase was washed with water (3×v30 mL), dried with sodium sulfate, and concentrated. The residue was purified by column chromatography (silica, 3% methanol in methylene chloride as eluant) to yield (7.5 g) of give TPS-ODOT-DFMS PAG as a white solid.

Lithographic evaluations were carried out as follows. Formulated photoresists were spin coated using a TEL Lithius coating track (TEL) onto 300 mm silicon wafers each having as a bottom antireflective coating (BARC) 76 nm AR™26N and an upper layer antireflective (BARC) 20 nm AR™124 (Rohm and Haas Electronic Materials LLC), each processed at 205° C./60 sec, and soft baked at 950° C./60 sec to form a resist film of about 110 nm in thickness, followed by application of a top coat (OC™2000). The photoresist layer was exposed using an ASML 1900i 193 nm immersion scanner operating at 193 nm using CQUAD 40° illumination (0.98/0.81s (inner/outer) and XY Polarization) at 1.35 NA through a photomask having 40 nm dense 1:1 lines/trenches, and the exposed photoresist layers were post-exposed baked (PEB) at 85-95° C. for 60 seconds. The exposed wafers were developed with 0.26N aqueous tetramethylammonium hydroxide solution (CD-26, Rohm and Haas Electronic Materials, LLC) to develop the photoresist layer. Linewidth and line edge roughness (LWR) were determined by top-down scanning electron microscopy (SEM) using a Hitachi 9380 CD-SEM, operating at an accelerating voltage of 800 volts (V), probe current of 8.0 picoamperes (pA), using 200 K× magnification at 1.0 digital zoom, with the number of frames set to 64. LWR was measured over a 2 pm line length in steps of 40 nm, and reported as the average for the measured region.

Photoresists for Lithographic Examples 1 and 2 (control), evaluated by the above lithographic conditions, were prepared by combining the components of AAEM polymer 1, photoresist polymer 2, PAGs (TPS ODOT DFMS either TBPTMS 3OH-Ad TFBS for Litho Example 1, or TBPTMS Ad TFBS for Litho Example 2 (control)), base (NBOC-TRIS) and solvent (propylene glycol monomethyl ether acetate, PGMEA; methyl 2-hydroxybutyrate, HBM; and cyclohexanone, CH)) according to the proportions in Table 1, below, and filtering using a 0.1 μm filter (total solids 3.510%).

TABLE 1

| Litho-graphic Example | AAEM Polymer (Polymer 1) | Photo-resist Polymer (Polymer 2) | PAG[a] | base[b] | SLA | Solvent |
|---|---|---|---|---|---|---|
| 1 | 0.520 g | 1.213 g | 0.346 g (16.4 wt %) | 0.025 g | 2.0 mg | PGMEA (17.37 g) HBM (28.95 g) CH (11.58 g) |
| 2 (Control) | — | 1.357 g | 0.205 g (13.0 wt %) | 0.015 g | 2.0 mg | PGMEA (13.03 g) HBM (21.71 g) CH (8.68 g) |

[a]Lithographic Example 1 - TBPTMS 3OH-Ad TFBS; Lithographic Example 2 (control) - TBPTMS AdTFBS.
[b]NBOC-TRIS:

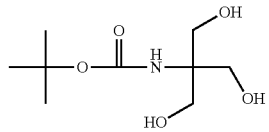

Lithographic processing of Lithographic Examples 1 and 2 (control) were evaluated as discussed above. Litho Example 1 contained 70 wt % of polymer 1(poly(IPAMA/MCPMA/a-GBLMA/ODOTMA/AAEM (20/20/30/20/10)) and 30 wt % of polymer 2 (poly(IPAMA/MCPMA/a-GBLMA/ODOTMA/HAMA 20/20/30/20/10)) based on the total polymer weight, whereas Litho Example 2 (control) based on 100 wt % polymer 2. The photoresists were evaluated for performance using 40 nm (1:1) lines and trenches.

Litho Example 1 was prepared to contain a low-diffusion PAG anion (i.e., 3OHAd TFBS) in slightly higher content (16.4 wt % based on solids), and was processed using a relatively low PEB temperature of 85° C./60 sec., where the formulation space is chosen for advantageous low mask-edge enhancement factor (MEEF) and low LWR. Litho Example 2 was formulated to include a PAG having the higher diffusing Ad TFBS anion in slightly lower content (13.0 wt % based on solids) and processed at a higher PEB temperature (90° C./60 sec).

Figure 2:
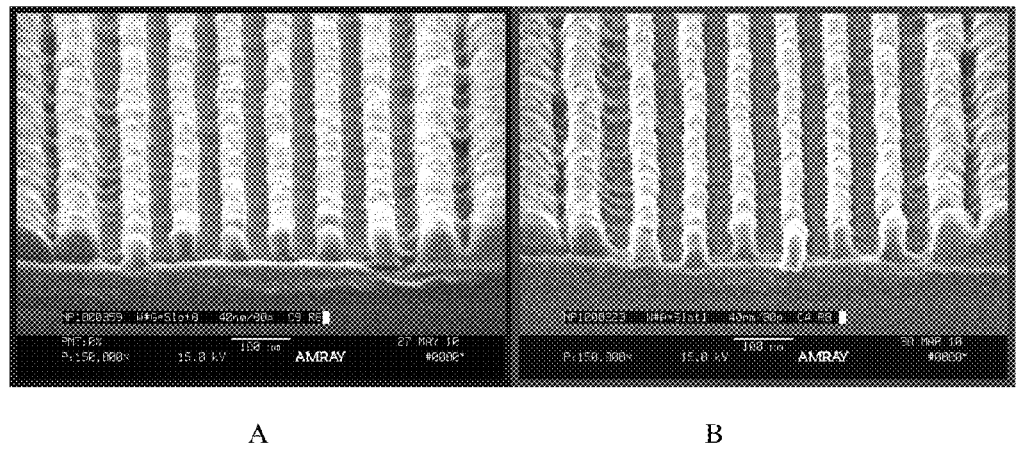
FIGS. 2A and 2B cross-sectional scanning electron microscope (SEM) images of (A) the exemplary photoresist including the polymer having the beta-dicarbonyl compound included, and (B) the control without the beta-dicarbonyl-containing polymer.

As seen in FIG. 1A, Litho Example 1 shows a reduced LWR (5.3 nm) relative to Litho Example 2 (control; 6.1 nm) in FIG. 1B. In addition, cross-sectional SEM images are seen in FIGS. 2A and 2B. In FIG. 2A, Lithographic Example 1 having the AAEM-containing polymer has cleaner trenches and a squarer profile relative to that seen for Lithographic Example 2 in FIG. 2B.

The AAEM monomer is believed to impart a lower glass transition temperature (Tg) to the copolymer (polymer 1) and hence impart an improved pattern collapse margin. While similar improvements in pattern collapse margins have been observed for higher PAG loading, higher PEB or use of more diffusive acid anions such as AdTFBS, increased resist top loss and/or MEEF and/or LWR may result. Use of AAEM monomer thus allows for use of lower PEBs and the 3OH AdTFBS PAG, resulting in improved LWR/MEEF without pattern collapse. Thus, because of the reduced steric bulk and lower Tg of the AAEM polymer, use of the low diffusion TMS 3OHAdTFBS PAG and a lower post exposure bake (PEB) of 85° C. can also be used, resulting in improved LWR for Litho Example 1.

Photoresists for Lithographic Examples 3 and 4 (control) were prepared by combining the components AAHAMA polymer 3, photoresist polymer 4, PAG (TPS ODOT DFMS and TBPTMS AdTFBS), base (NBOC-TRIS) and solvent (propylene glycol monomethyl ether acetate, PGMEA; methyl 2-hydroxybutyate, HBM; and cyclohexanone, CH)) according to the proportions in Table 2, below, and filtering using a 0.1 µm filter (total solids 3.700%).

TABLE 2

| Lithographic Example | AAHAMA Polymer (Polymer 3) | Photoresist Polymer (Polymer 4) | PAG 1[a] | PAG 2[b] | Base[c] | Solvent |
|---|---|---|---|---|---|---|
| 3 | 2.42 g | — | 0.193 g | 0.299 g | 0.053 g | PGMEA (23.11 g) HBM (42.37 g) CH (11.56 g) |
| 4 (Control) | — | 2.41 g | 0.193 g | 0.299 g | 0.053 g | PGMEA (23.11 g) HBM (42.37 g) CH (11.56 g) |

[a]TPS ODOT DFMS.
[b]TBPTMS AdTFBS.
[c]NBOC-TRIS.

Lithographic Examples 3 and 4 were evaluated for 40 nm dense trenches, at three different PEB temperatures (95, 90, and 85° C. The results are shown in Table 3, below.

TABLE 3

| | PEB | | | |
|---|---|---|---|---|
| Lithographic Example | 95° C. (mJ/cm$^2$) | 90° C. (mJ/cm$^2$) | 85° C. (mJ/cm$^2$) | PEBS (nm/° C.) |
| 3 | 24.4 | 25.2 | 27.6 | 0.44 |
| 4 (control) | 22.4 | 22.9 | 22.9 | 0.09 |

As seen in the above data in Table 3, the polymer containing AAHAMA (Litho Example 3) was found to have significantly lower PEB temperature sensitivity (0.09 nm/° C.) than the polymer containing HAMA (Litho Example 4; 0.44 nm/° C.). Reduced PEB sensitivity obtained by incorporating AAHAMA into the polymer can allow for processing of higher activation energy ($E_a$) leaving groups such as tert-butyl methacrylate, at lower processing temperatures.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A copolymer, comprising the polymerized product of a base-soluble monomer of formula (I):

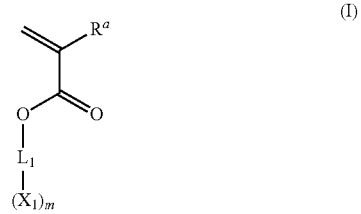

wherein:
$R^a$ is H, F, $C_{1-10}$ alkyl, or $C_{1-10}$ fluoroalkyl,
$L_1$ is an m+1 valent $C_{2-30}$ alkylene, $C_{3-30}$ cycloalkylene, $C_{6-30}$ arylene, $C_{7-30}$ aralkylene group,
m+1 is an integer of 2 to 5,
each $X_1$ is independently

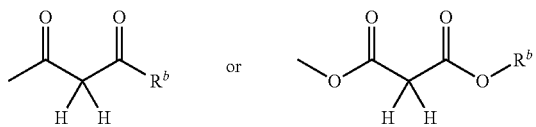

wherein $R^b$ is $C_{1-20}$ alkyl; $C_{1-20}$ fluoroalkyl, $C_{3-20}$ cycloalkyl, $C_{6-20}$ aryl, $C_{7-20}$ aralkyl, or a combination comprising at least one of the foregoing, and
an additional monomer copolymerizable with the base-soluble monomer of formula (I); wherein the additional monomer is a (meth)acrylate monomer having an acid deprotectable base soluble group, a (meth)acrylate monomer having a lactone functional group, a (meth)acrylate monomer having a base-soluble group not identical to that of formula (I), or a combination comprising at least one of the foregoing monomers.

2. The copolymer of claim 1, wherein the base soluble monomer is:

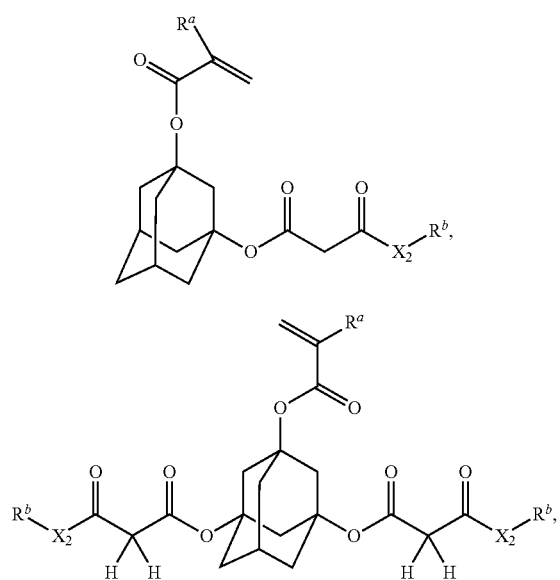

or a combination comprising at least one of the foregoing, wherein $R^a$ is H, F, $C_{1-6}$ alkyl, or $CF_3$, $X_2$ is O, and $R^b$ is $C_{1-20}$ alkyl; $C_{1-20}$ fluoroalkyl, $C_{3-20}$ cycloalkyl, $C_{6-20}$ aryl, $C_{7-20}$ aralkyl, or a combination comprising at least one of the foregoing.

3. The copolymer of claim 1, wherein the additional monomer is the (meth)acrylate monomer having an acid-deprotectable base soluble group, wherein the (meth)acrylate monomer having an acid-deprotectable base soluble group comprises:

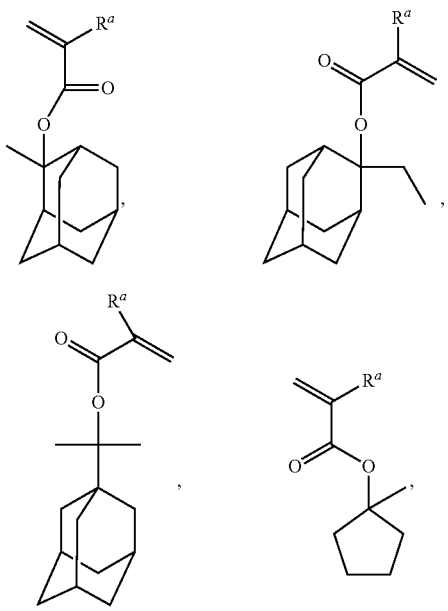

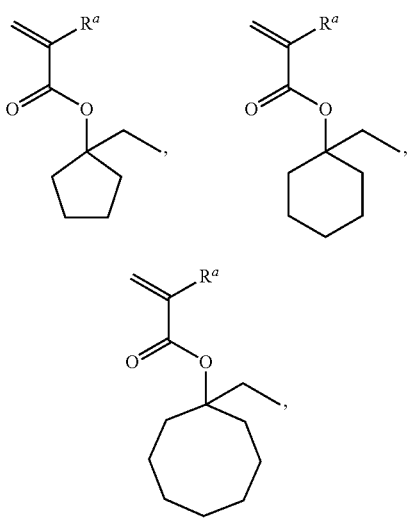

or a combination comprising at least one of the foregoing monomers, wherein $R^a$ is H, F, $C_{1-10}$ alkyl, or $C_{1-10}$ fluoroalkyl.

4. The copolymer of claim 1, wherein the additional monomer is the (meth)acrylate monomer having a lactone functional group, wherein the (meth)acrylate monomer having a lactone functional group comprises:

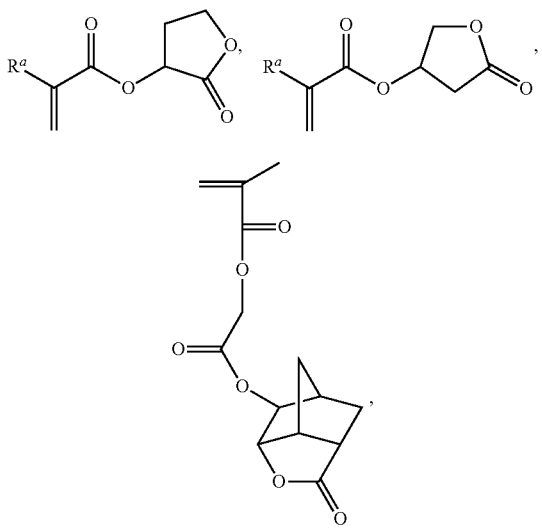

or a combination comprising at least one of the foregoing monomers, wherein $R^a$ is H, F, $C_{1-10}$ alkyl, or $C_{1-10}$ fluoroalkyl.

5. The copolymer of claim 1, wherein the additional monomer is the (meth)acrylate monomer having a base-soluble group not identical to that of formula (I), wherein the (meth)acrylate monomer having a base-soluble group not identical to that of formula (I) comprises:

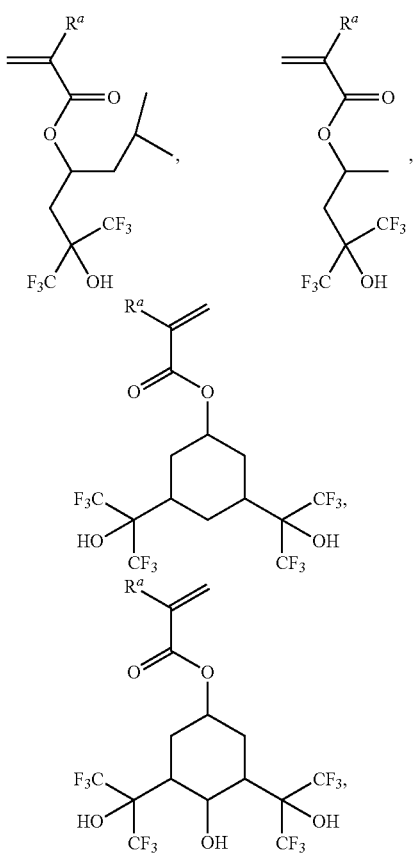

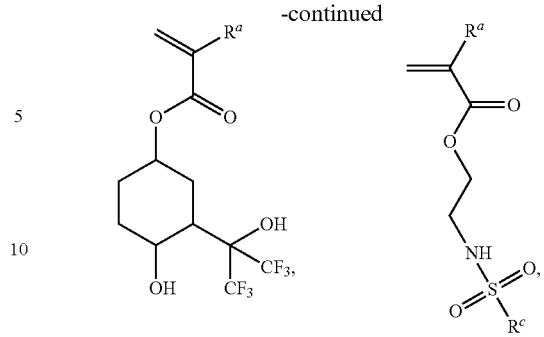

or a combination comprising at least one of the foregoing monomers, wherein $R^a$ is H, F, $C_{1-10}$ alkyl, or $C_{1-10}$ fluoroalkyl, and $R^c$ is a $C_{1-4}$ perfluoroalkyl group.

6. A photoresist comprising the copolymer of claim 1;

a photoacid generator; and optionally, a second acid sensitive polymer, and/or an amine or amide additive.

7. A coated film comprising:

a photoresist comprising the copolymer of claim 1;

a photoacid generator; and optionally, a second acid sensitive polymer, and/or an amine or amide additive.

* * * * *